United States Patent [19]

King

[11] 4,114,177

[45] Sep. 12, 1978

[54] OPTICALLY COUPLED DEVICE WITH DIFFUSELY REFLECTING ENCLOSURE

[75] Inventor: William Clifton King, Short Hills, N.J.

[73] Assignee: Bell Telephone Laboratories, Incorporated, Murray Hill, N.J.

[21] Appl. No.: 573,401

[22] Filed: May 1, 1975

[51] Int. Cl.² ............................................. H01L 31/14
[52] U.S. Cl. ..................................... 357/19; 250/551; 357/70; 357/75
[58] Field of Search ................... 357/17, 19; 250/551, 250/211 J, 239, 228; 356/243, 236

[56] References Cited

U.S. PATENT DOCUMENTS

| 3,628,039 | 12/1971 | Ochs et al. | 250/551 |
| 3,723,747 | 3/1973 | Steele | 250/239 |
| 3,780,357 | 12/1973 | Haitz | 357/17 |
| 3,818,451 | 6/1974 | Coleman | 340/166 EL |
| 3,845,318 | 10/1974 | Thillays | 250/551 |

*Primary Examiner*—William D. Larkins
*Assistant Examiner*—Marcus S. Rasco
*Attorney, Agent, or Firm*—Allen N. Friedman

[57] ABSTRACT

The disclosed optically coupled device includes one or more light emitting input semiconductor devices coupled by a transparent and electrically insulating medium to one or more output semiconductor devices which produce an electrical signal in response to the light received from the input device. Some such devices are known as opto-isolators or optically coupled isolators. In the disclosed devices the transparent medium is surrounded by a diffusely reflecting enclosure, which tends to make the device characteristics less sensitive to variations in fabrication. Efficient planar opto-isolator structures are disclosed.

4 Claims, 5 Drawing Figures

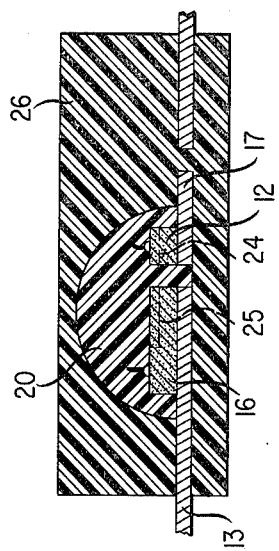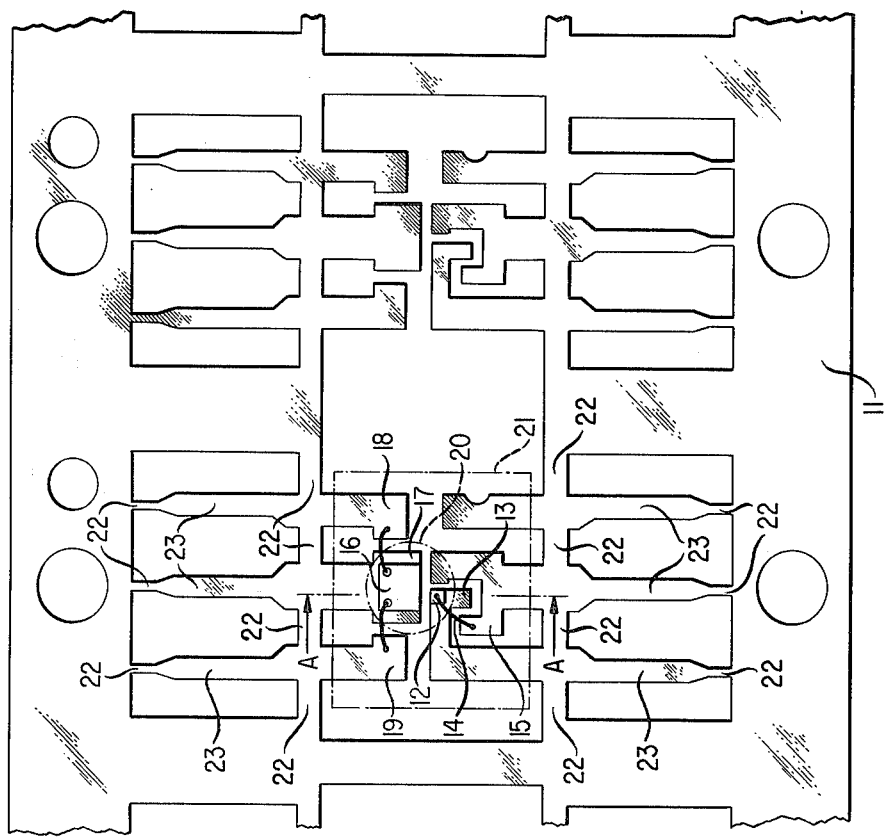

OPTICALLY COUPLED DEVICE WITH DIFFUSELY REFLECTING ENCLOSURE

Background of the Invention

1. Field of the Invention

The invention is in the field of light coupled semiconductor devices.

2. Brief Description of the Prior Art

The largest class of light coupled semiconductor, devices in the prior art are known as opto-isolators or optically coupled isolators. In some opto-isolators, which bear a relationship to the opto-isolators of the instant application, the light emitting diodes and the detector devices are bonded to separate lead frames. During fabrication these lead frames are positioned opposite one another in such a way as to place the light emitting diodes in close proximity to the detectors. Drops of electrically insulating transparent polymeric material are introduced between the diodes and the detectors. The composite structure is then potted in a mass of black electrically insulating polymer material for protection and isolation from ambient light. Such devices are exemplified in U.S. Pat. No. 3,727,064 issued Apr. 10, 1973 and U.S. Pat. No. 3,808,673 issued May 7, 1974. Some optically coupled devices, generally similar to those above, include a reflecting coating applied to the clear polymeric material prior to the protective potting (U.S. Pat. No. 3,660,669 issued May 2, 1962). A somewhat similar device mounted on a header with the semiconductor device embedded in a body of glass, includes a layer of reflective material applied to the glass, for both reflection and optical isolation (U.S. Pat. No. 3,818,451 issued June 18, 1974). In operation, such devices which depend on light reflected within the transparent medium can be somewhat sensitive to the placement of the semiconductor devices within the package. In addition, the application of reflective coatings represents an additional processing step, adding to the cost of the ultimate device.

SUMMARY OF THE INVENTION

A technique has been developed for the production of inexpensive efficient light coupled semiconductor devices (e.g., opto-isolators). In these devices the semiconductor elements are placed in an optically transparent cavity or body which is surrounded by a body of diffusely reflecting material. Some of the economy inherent in these devices lies in the fact that they can be fabricated in planar form either on a rigid substrate or utilizing a single flat lead frame. The diffusely reflecting body can also serve to provide the required mechanical protection, integrity and isolation from extraneous ambient light. Efficient plastic packaged devices adapted for automated insertion into printed circuit boards have been fabricated.

BRIEF DESCRIPTION OF THE DRAWINGS

FIG. 1 is a plan view of a single planar lead frame device indicating the position of the semiconductor elements and plastic encapsulants;

FIG. 2 is an elevational view in section of an exemplary opto-isolator;

FIG. 3 is an elevational view in section of a further exemplary opto-isolator;

DETAILED DESCRIPTION OF THE INVENTION

Figure 5:
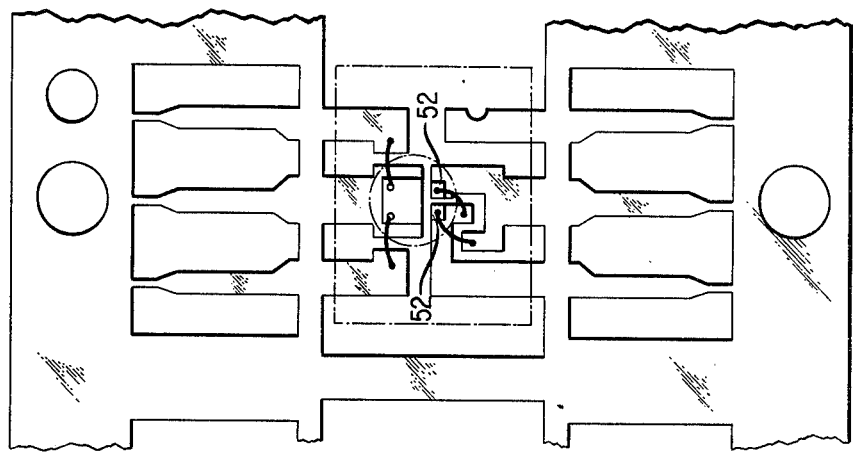
FIG. 5 is a plan view of a single lead frame device indicating the position of two emitters and a single detector.

The light coupled semiconductor devices which benefit from these teachings are exemplified by a class of devices known as opto-isolators. Such devices include one or more semiconductor elements which emit electromagnetic radiation in the optical and near optical frequency range (e.g., including the infrared) in response to impressed electrical signals. The device also includes at least one semiconductor element adapted for absorbing such electromagnetic radiation and producing an electrical output signal. The elements are included within an electrically insulating medium which is transparent to the emitted radiation. These optically coupled devices provide electrical isolation between the sending and receiving circuits. FIG. 1 shows an exemplary opto-isolator in an early stage of production. The single planar lead frame 11 is a thin sheet of conductor such as gold plated beryllium copper or gold plated nickel. A light emitting diode 12 is bonded to a bonding pad 13 and a wire bond 14 connects the upper surface of the diode 12 to a second bonding pad 15. The detecting device 16, which may be, for example, a phototransistor, a photo-Darlington pair, or a photosensitive silicon controlled rectifier, is bonded to another bonding pad 17 and selected areas of the upper surface of the detector 16 are wire bonded to bonding pads 18 and 19. These two semiconductor elements 12, 16 are enclosed in a dome of a transparent electrically insulating polymeric material (e.g., silicone or epoxy resins) whose bound is denoted by the dotted circle 20. In a later stage of fabrication the device as shown will be potted in a mass of polymeric material which will provide isolation from ambient light and mechanical integrity to the device. The outer bounds of this potting material are indicated by the dashed rectangle 21. Subsequently the connecting bars 22 will be removed and the finished device will appear as a mass of polymer 21 with protruding contact pins 23. The resulting package is commonly referred to as a dual-in-line package. Similar devices can be constructed on a rigid substrate with a similar pattern of conducting bonding pads. However connecting bars 22 will, typically, not be necessary in this fabrication technique.

FIG. 2 shows a cross section (A—A section of FIG. 1) of a coupled device such as illustrated at an earlier stage of fabrication in FIG. 1. As in FIG. 1 the light emitting diode 12 and the photodetector 16 are affixed to metallic bonding pads 13, 17. These semiconductor devices 12, 16 are embedded in a quantity of transparent polymeric material 20. The dashed lines 24, 25 within the semiconductor devices 12, 16 represent the photoactive junctions within the respective semiconductor devices 12, 16. The above structures are completely enclosed in a mass 26 of polymeric material. This polymeric material is loaded with a particulate pigment, such as titanium dioxide, which serves to diffusely reflect light passing from the transparent material 20 into the surrounding material 26 and is loaded to such a density as to prevent a significant response of the photodetector to extraneous ambient light originating from outside the polymeric outer coating 26. This diffuse reflection property has an averaging effect for light within the transparent medium 20 and tends to make the transfer of light from the emitting diode 12 to the detector 16 less sensitive to such factors as the precise relative placement of the emitter 12 and detector 16. The fact that this diffuse reflection takes place to some extent between the pigment particles within the bulk of the surrounding material 26 enhances this averaging effect. The planar configuration of this device is advantageous in several respects. It makes possible the use of a single lead frame 11 as opposed to the two lead frame construction of many prior art devices. In production the two lead frames in such devices must be accurately positioned relative to one another which adds to the costs of the produced devices. As can be seen from FIG. 1 and FIG. 2 all electrical connections are made to either the upper or lower surfaces of the semiconductor devices 12, 16 with no contact wires intruding into the space between these devices as is usually the case with prior art devices using two lead frames. This increases the interdevice electrical high voltage isolation achievable for a given interdevice spacing. The device shown in FIG. 2 is the plastic encapsulated portion of a dual-in-line device package which is adapted for automated insertion into printed circuit boards.

FIG. 3 is a device similar to the device of FIG. 2 illustrating however the possible use of a gaseous or polymeric transparent medium 30 and a shell of diffusely reflecting material 36 within a larger body 37 of material intended to provide protection and mechanical integrity.

Figure 4:
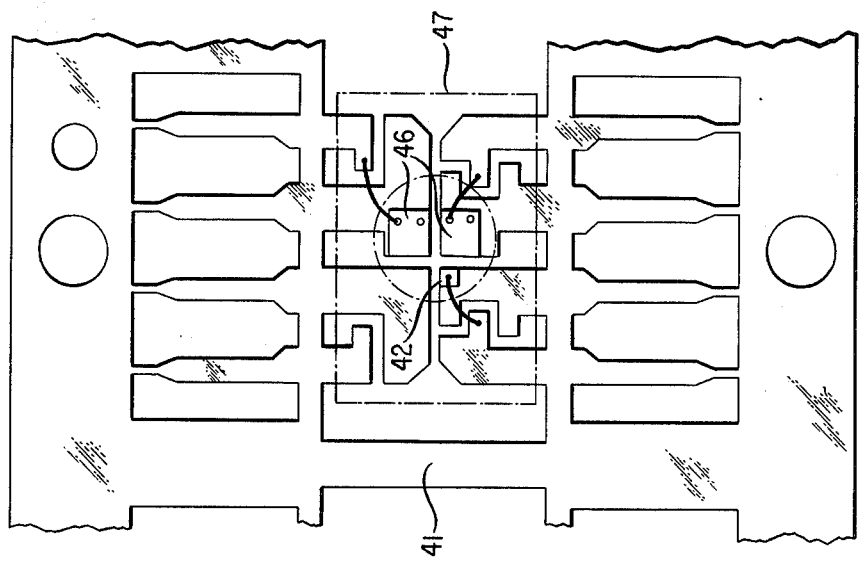
FIG. 4 is a plan view of a single planar lead frame device indicating the positioning of two detectors and a single emitter.

FIG. 4 shows a portion of a one piece planar lead frame 41 designed to produce an 8 pin dual-in-line package containing an optically coupled device with a single light emitting diode 42 and two light detectors 46. The diffuse reflecting properties of the subsequently placed encapsulating material (indicated in outline by the dotted line 47) are particularly important for such a device because the light transfer properties between the light emitter 42 and two detectors 46 are now involved. In this case a specularly reflecting enclosure could strongly favor one light transmission path over the other. This is also the case for devices such as those illustrated in FIG. 5, containing more than one light emitting device 52. These comments apply at least equally as well to optically coupled devices with more elements within the optical enclosure. Two element and three element devices have been made in accordance with the above disclosure. For example, devices such as pictured in FIGS. 1 and 2 have been made using gallium phosphide light emitting diodes 12 and silicon phototransistors 16 with a clear silicone dome 20 and a reflective body 26, 21 consisting of an epoxy resin loaded with 10% by weight of particulate titanium dioxide. An exemplary device, with ten milliamperes flowing through the photodiode had a current transfer ratio of ~0.4% to the base of the phototransistor and a current amplification of ~150 in the transistor, resulting in an overall current transfer ratio of ~60%.

What is claimed is:

1. A device comprising at least one first semiconductor device for emitting light in response to an impressed electrical excitation, at least one second semiconductor device, for receiving the light emitted by the first semiconductor device and for producing an electrical signal in response to the light, an electrically insulating light transmitting medium for transmitting the light from the first semiconductor device to the second semiconductor device, and an enclosure CHARACTERIZED IN THAT the enclosure includes a body of reflecting material adapted for diffusely reflecting the light, wherein the reflecting material is a polymeric material including a particulate pigment which is reflective to the emitted light.

2. A device of claim 1 in which the sum of the number of first semiconductor devices and the number of second semiconductor devices is at least three.

3. A device of claim 1 including first connecting means for impressing the electrical excitation on the at least one first semiconductor device and second connecting means for coupling the electrical signal out of the at least 1 second semiconductor device.

4. A device comprising at least one first semiconductor device for emitting light in response to an impressed electrical excitation, at least one second semiconductor device, for receiving the light emitted by the first semiconductor device and for producing an electrical signal in response to the light, an electrically insulating light transmitting medium for transmitting the light from the first semiconductor device to the second semiconductor device, and an enclosure CHARACTERIZED IN THAT the enclosure includes a body of reflecting material adapted for diffusely reflecting the light, wherein the reflecting material is a polymeric material including a particulate pigment which is reflective to the emitted light, wherein the insulating light transmitting medium is a clear polymeric material, and wherein the body of a reflecting material is adapted to also serve as the outer protective container of the device.

* * * * *